US011815569B2

(12) United States Patent
Kim

(10) Patent No.: US 11,815,569 B2
(45) Date of Patent: Nov. 14, 2023

(54) MAGNETIC SENSOR AND HALL SENSOR, EACH USING ANOMALOUS HALL EFFECT, AND METHOD FOR MANUFACTURING HALL SENSOR

(71) Applicants: INDUSTRY ACADEMY COOPERATION FOUNDATION OF SEJONG UNIVERSITY, Seoul (KR); NANOGATE, Gangwon-do (KR)

(72) Inventor: Tae Wan Kim, Yongin-si Gyeonggi-do (KR)

(73) Assignees: INDUSTRY ACADEMY COOPERATION FOUNDATION OF SEJONG UNIVERSITY; NANOGATE

( * ) Notice: Subject to any disclaimer, the term of this patent is extended or adjusted under 35 U.S.C. 154(b) by 287 days.

(21) Appl. No.: 17/296,975

(22) PCT Filed: Nov. 29, 2019

(86) PCT No.: PCT/KR2019/016704
§ 371 (c)(1),
(2) Date: May 25, 2021

(87) PCT Pub. No.: WO2020/111862
PCT Pub. Date: Jun. 4, 2020

(65) Prior Publication Data
US 2022/0026506 A1 Jan. 27, 2022

(30) Foreign Application Priority Data
Nov. 30, 2018 (KR) .................. 10-2018-0152366
Nov. 30, 2018 (KR) .................. 10-2018-0152367

(51) Int. Cl.
*G01R 33/07* (2006.01)
*H10N 52/00* (2023.01)

(52) U.S. Cl.
CPC ............ *G01R 33/07* (2013.01); *H10N 52/00* (2023.02)

(58) Field of Classification Search
CPC ..... G01R 33/07; G01R 33/0052; H10N 52/00; H10N 50/85
See application file for complete search history.

(56) References Cited

U.S. PATENT DOCUMENTS 9,940,956 B1 * 4/2018 Cao ................... G11B 5/3106
2003/0039062 A1 * 2/2003 Takahasahi ......... G01R 33/093
(Continued)

FOREIGN PATENT DOCUMENTS

KR 20050084288 A 8/2005
KR 20090060063 A 6/2009
(Continued)

*Primary Examiner* — Alvaro E Fortich
(74) *Attorney, Agent, or Firm* — Renaissance IP Law Group LLP

(57) ABSTRACT

Provided is a magnetic sensor using an anomalous Hall effect. Nonmagnetic metal layers are disposed on and below a ferromagnetic material so as to form a Hall voltage corresponding to a change in applied magnetic field. Linearity and saturation magnetization of the magnetic sensor depend on a thickness of the nonmagnetic metal layer and a thickness of the ferromagnetic material. In addition, provided is a Hall sensor using an anomalous Hall effect. Nonmagnetic metal layers are formed with respect to a ferromagnetic layer, and CoFeSiB constituting the ferromagnetic layer has a thickness ranging from 10 Å to 45 Å. A magnetic easy axis is formed in a direction perpendicular to an interface due to interface inducing action of the nonmagnetic metal layers. In addition, the Hall sensor includes a sensing region having a rhombic shape, an electrode line portion having a line shape, and a pad portion.

26 Claims, 16 Drawing Sheets

(56) References Cited

U.S. PATENT DOCUMENTS

| | | | |
|---|---|---|---|
| 2004/0144995 A1 | 7/2004 | Nagahama et al. | |
| 2008/0124582 A1* | 5/2008 | Kim | G11B 5/66 |
| 2009/0128282 A1* | 5/2009 | Zimmer | B82Y 25/00 |
| | | | 29/610.1 |
| 2009/0176129 A1* | 7/2009 | Sarbanoo | H10N 52/00 |
| | | | 428/811.3 |
| 2011/0227018 A1* | 9/2011 | Kuribayashi | H10N 50/85 |
| | | | 257/E21.09 |
| 2013/0015542 A1* | 1/2013 | Wang | H01L 29/82 |
| | | | 257/E29.323 |
| 2014/0001586 A1* | 1/2014 | Shen | H10N 50/85 |
| | | | 257/421 |
| 2014/0247043 A1* | 9/2014 | Klein | G01R 33/07 |
| | | | 324/251 |
| 2016/0276006 A1* | 9/2016 | Ralph | H01F 10/3263 |

FOREIGN PATENT DOCUMENTS

| | | |
|---|---|---|
| KR | 20110003773 A | 1/2011 |
| KR | 20150088074 A | 7/2015 |

\* cited by examiner

MAGNETIC SENSOR AND HALL SENSOR, EACH USING ANOMALOUS HALL EFFECT, AND METHOD FOR MANUFACTURING HALL SENSOR

TECHNICAL FIELD

The present disclosure relates to a magnetic sensor, and more particularly, to a magnetic sensor and a Hall sensor using an anomalous Hall effect and a method of manufacturing the Hall sensor.

BACKGROUND ART

Magnetic sensors are devices that sense a change in magnetic field and convert the change into an electrical signal. Thus, an actual input of the magnetic sensor is a magnetic field, and an output thereof is an electrical signal. Typical magnetic sensors are Hall sensors. The Hall sensors are devices that use a Hall effect. The Hall effect is referred to as a phenomenon in which a potential difference occurs in a direction perpendicular to both of a current direction and a magnetic field direction under a condition in which a current flows in a direction traversing a magnetic field.

Materials suitable for manufacturing Hall sensors need to have a low carrier concentration and high carrier mobility. When a carrier concentration is high, a velocity of carriers is reduced due to scattering of the carriers and thus a Lorentz force acting on the carriers is reduced. When mobility is high, a drift velocity is increased and thus a Lorentz force is increased.

Thus, traditional Hall sensors using a Lorentz force are formed of a metal or a semiconductor as a base material. However, since the metal has problems in that a carrier concentration is high, an output voltage is reduced due to scattering of carriers, and linearity is reduced, Hall sensors using the semiconductor are manufactured and studied. However, the Hall sensors using the semiconductor have problems in that a size of a sensor pattern should be increased in order to increase an output voltage and high offset voltage output occurs. In addition, a distance between a magnet and a sensor should be very short, and a phenomenon of a characteristic distortion occurs at a high driving temperature.

Hall sensors should have characteristics suitable for an environment in which the Hall sensors are used. Typically, the Hall sensors need to have a low offset voltage, a high level of a Hall voltage, and high resolution. In order to implement such characteristics, the Hall sensors have an approximately cross-shaped structure, an n-doped sensing region is formed on a semiconductor substrate, and the sensing region has an approximately cross-shaped structure.

The most representative Hall sensor is a gallium arsenide (GaAs)-type Hall sensor. The GaAs-type Hall sensor has a high Hall voltage as an output voltage and is used to implement an optical image stabilizer for a camera due to a low offset voltage.

FIG. 1 is a perspective view illustrating a structure of a Hall sensor according to the related art.

Referring to FIG. 1, a GaAs-type Hall sensor is provided as the Hall sensor. A GaAs substrate is used as a substrate 10 to manufacture the Hall sensor. An n-type GaAs layer is grown on the substrate 10 through a metal organic chemical vapor deposition (MOCVD) process. After the layer is grown, a photoresist pattern is formed using a typical photolithography process. Subsequently, when etching is performed using the photoresist pattern as an etching mask, it is possible to obtain an n-doped sensing region 20 having a cross shape on the substrate 10. End portions of the cross shape in the sensing region 20 should be electrically connected to metal lines 31, 32, 33, and 34. The metal lines 31, 32, 33, and 34 are formed through a typical lift-off process or a selective etching process after deposition of a metal film. The formed metal lines 31, 32, 33, and 34 are formed to overlap the end portions of the sensing region 20 and are formed directly on the substrate 10 made of GaAs in a region in which the sensing region 20 is not formed.

The metal lines 31, 32, 33, and 34 are electrically connected to pads formed in certain regions of the substrate 10. The pads are made of the same material as the metal lines 31, 32, 33, and 34 and are formed concurrently with the metal lines 31, 32, 33, and 34. However, the pads differ from the metal lines 31, 32, 33, and 34 in shape and size.

However, the GaAs-type Hall sensor shown in FIG. 1 has disadvantages in that intensity of an applied magnetic field should be very high and the GaAs-type Hall sensor is sensitive to a change in temperature. The high intensity of the applied magnetic field is interpreted to mean that the GaAs-type Hall sensor does not have high resolution with respect to a change in magnetic field. In addition, when a temperature is changed, a variation in Hall voltage occurs, which causes a reduction in an operating characteristic of the Hall voltage which is changed linearly with intensity of an applied magnetic field.

To solve such problems, giant magnetoresistance (GMR) sensors and tunneling magnetoresistance (TMR) sensors are used. These sensors are sensors that use interlayer interaction between a ferromagnetic material and other materials, and it is described that the sensors use a magnetic induction phenomenon of spin electrons.

The GMR sensor is also known as a giant magnetoresistive effect sensor. The giant magnetoresistive effect sensor has a structure in which a nonmagnetic material is interposed between two ferromagnetic materials. In a state in which a current flows in a direction perpendicular to an interface between the nonmagnetic material and the ferromagnetic material, an external magnetic field is applied in a direction parallel to the interface. Due to the magnetic field applied in the direction parallel to the interface, a spin current and a magnetic moment of the ferromagnetic material may have the same direction or may have different directions. Thus, resistance between the two ferromagnetic materials is determined, and horizontal magnetic anisotropy in the ferromagnetic materials is changed, which appears as a Hall voltage.

The TMR sensor has a structure in which a tunnel barrier layer, that is, one of insulating layers, is interposed between two ferromagnetic materials. A magnetic moment is parallel to an interface. However, when a current flows in a direction perpendicular to an interface between the two ferromagnetic materials, an amount of current is changed as if a valve exists, which is referred to as a spin valve. The spin valve controls an amount of electrons passing through the tunnel barrier layer. However, the ferromagnetic materials may have horizontal magnetic anisotropy, and a magnetic field may be applied in a direction parallel to the interface to induce a Hall voltage.

In the above-described new GMR and TMR sensors, a magnetic field is applied in a direction parallel to the interface between the ferromagnetic materials, and a change in magnetic field is implemented into a Hall voltage. Therefore, when the sensor is packaged in a use environment and mounted on a substrate, there is a problem in that the sensor is not smoothly applied.

DISCLOSURE

Technical Problem

The present invention is directed to providing a magnetic sensor, which includes a multi-layered thin film, using an anomalous Hall effect.

The present invention is directed to providing a Hall sensor, which uses a magnetic field applied perpendicular to an interface of a ferromagnetic material, using an anomalous Hall effect.

The present invention is directed to providing a method of manufacturing a Hall sensor using an anomalous Hall effect.

Technical Solution

According to an embodiment of the present invention, a magnetic sensor using an anomalous Hall effect includes a lower nonmagnetic metal layer which is formed on a substrate and has a polycrystalline structure, a ferromagnetic layer which is formed on the lower nonmagnetic metal layer and in which an anomalous Hole effect is generated by an applied magnetic field, and an upper nonmagnetic metal layer which is formed on the ferromagnetic layer and has a polycrystalline structure.

According to another embodiment of the present invention, a Hall sensor using an anomalous Hall effect includes a sensing region which has a rhombic shape and generates a Hall voltage according to a Hall effect with respect to a magnetic field applied perpendicular thereto, an electrode line portion which is integrally connected to vertices of the rhombic shape of the sensing region and through which an input current is applied and the Hall voltage is output, and a pad portion which is integrally formed with the electrode line portion and electrically connected to the outside.

According to still another embodiment of the present invention, a method of manufacturing a Hall sensor using an anomalous Hall effect includes sequentially forming a lower nonmagnetic metal layer, a ferromagnetic layer, and an upper nonmagnetic metal layer on a substrate, forming a photoresist pattern on the upper nonmagnetic metal layer, and performing selective etching using the photoresist pattern as an etching mask to expose a portion of the substrate and to concurrently form a sensing region which has a rhombic shape and generates a Hall voltage according to a Hall effect with respect to a magnetic field applied perpendicular thereto, an electrode line portion which is integrally connected to vertices of the rhombic shape of the sensing region and through which an input current is applied and the Hall voltage is output, and a pad portion which is integrally formed with the electrode line portion and electrically connected to the outside.

Advantageous Effects

According to the present invention described above, nonmagnetic metal layers are disposed on and below a ferromagnetic material, and the two nonmagnetic metal layers include the same material. In addition, a thickness of the ferromagnetic material is set to be less than or equal to 45 Å (angstroms) or less. When the thickness exceeds 45 Å, in the ferromagnetic material, a magnetic easy axis in a vertical direction can be difficult to form, and vertical magnetic anisotropy cannot be secured. Therefore, even when a magnetic field and an input current are increased, a sensitivity characteristic cannot be secured, and linearity can be destroyed. In addition, a thickness of the nonmagnetic metal layer in contact with the ferromagnetic material is set to be less than or equal to the thickness of the ferromagnetic material. Therefore, a magnetic sensor with high linearity and high sensitivity can be obtained.

In addition, in the present invention, an electrode line portion and a pad portion have the same stacked structure as a sensing region. That is, in a manufacturing process, one photo mask is used, and an etching process is performed once, thereby manufacturing a Hall sensor. Thus, high productivity is secured.

Furthermore, according to the present invention, a magnetic field applied in a direction perpendicular to an interface is used, and an anomalous Hall effect is used in which a magnitude of vertical magnetic anisotropy of a ferromagnetic layer is changed according to the applied magnetic field. Therefore, it is possible to obtain a Hall sensor which is insensitive to a change in temperature and has high sensitivity, and it is possible to induce a Hall effect by applying a magnetic field in a direction perpendicular to an interface of the ferromagnetic layer, thereby applying the Hall sensor in a very flexible use environment.

DETAILED DESCRIPTION

Figure 1:
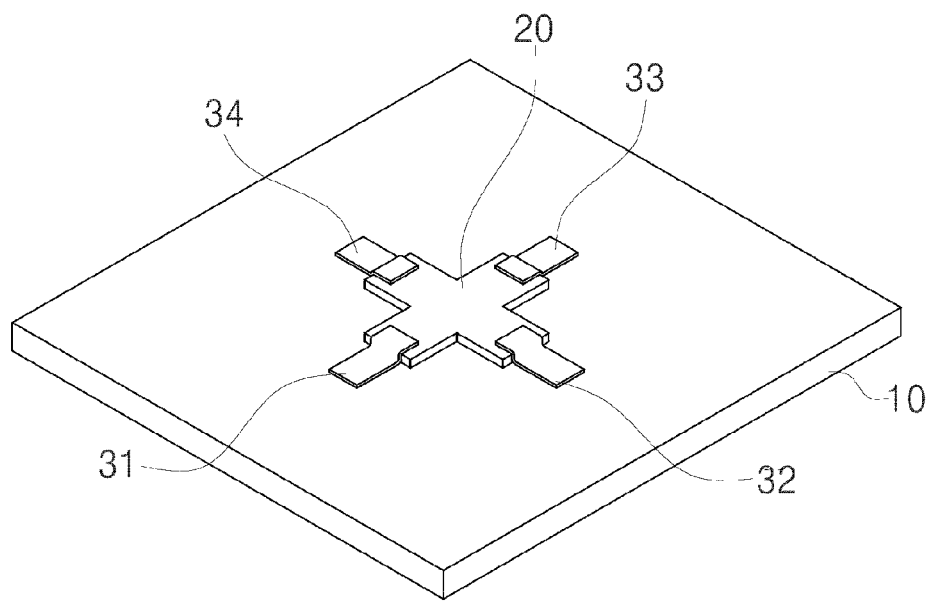
FIG. 1 is a perspective view illustrating a structure of a Hall sensor according to the related art.

While the present invention is open to various modifications and alternative embodiments, specific embodiments thereof will be described and shown by way of example in the accompanying drawings. However, it should be understood that there is no intention to limit the present invention to the particular embodiments disclosed, and, on the contrary, the present invention is to cover all modifications, equivalents, and alternatives falling within the spirit and scope of the present invention. In describing the drawings, like reference numerals are used for like elements.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art and should not be interpreted in an idealized or overly formal sense unless expressly defined otherwise in the present invention.

Hereinafter, exemplary embodiments of the present invention will be described in more detail with reference to the accompanying drawings.

First Embodiment

Figure 2:
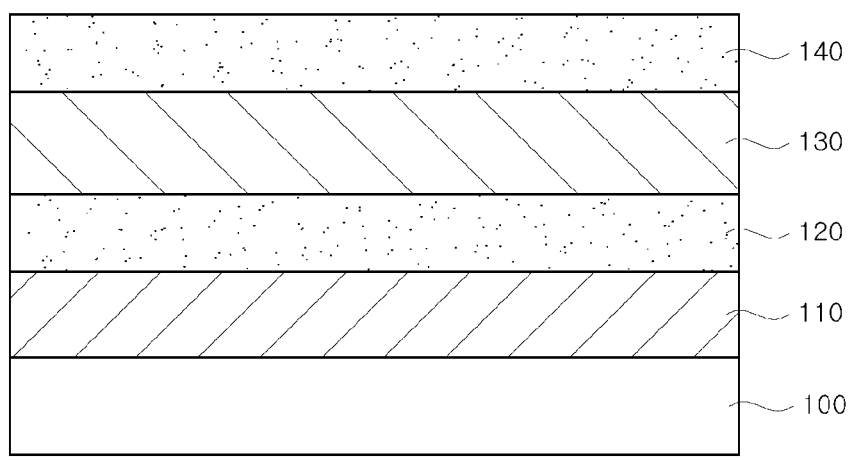
FIG. 2 is a cross-sectional view of a magnetic sensor using an anomalous Hall effect according to a first embodiment of the present invention.

FIG. 2 is a cross-sectional view of a magnetic sensor using an anomalous Hall effect according to a first embodiment of the present invention.

Referring to FIG. 1, a substrate 100, a buffer layer 110, a lower nonmagnetic metal layer 120, a ferromagnetic layer 130, and an upper nonmagnetic metal layer 140 are provided.

The substrate 100 may be made of an insulating material and may include silicon oxide or silicon nitride. In addition, the substrate 100 may use any material as long as physical properties of the material are not significantly changed even when the buffer layer 110 to the upper nonmagnetic metal layer 140 are formed in subsequent processes.

The buffer layer 110 is formed on the substrate 100. The buffer layer 110 is provided to facilitate the formation of the lower nonmagnetic metal layer 120. That is, when the lower nonmagnetic metal layer 120 is formed directly on the substrate 100 made of an insulating material, the lower nonmagnetic metal layer 120 may not have a predetermined lattice constant or may not form crystal grains, and thus, a polycrystalline structure may not be formed. Therefore, the lower nonmagnetic metal layer 120 is easily formed in a polycrystalline state through the formation of the buffer layer 110. The buffer layer 110 may be made of tantalum (Ta), rubidium (Ru), or titanium (Ti).

The lower nonmagnetic metal layer 120 is formed on the buffer layer 110. The lower nonmagnetic metal layer 120 is in a polycrystalline state and causes stress at an interface with the ferromagnetic layer 130. In addition, the lower nonmagnetic metal layer 120 induces vertical magnetic anisotropy at an interface portion of the ferromagnetic layer 130 through magnetic interaction at the interface with the ferromagnetic layer 130. The lower nonmagnetic metal layer 120 may be made of platinum (Pt) or palladium (Pd).

The ferromagnetic layer 130 is formed on the lower nonmagnetic metal layer 120. The ferromagnetic layer 130 is made of an alloy of CoFeSiB. Vertical magnetic anisotropy and horizontal magnetic anisotropy are mixed in a bulk region in the ferromagnetic layer 130. That is, vertical magnetization and horizontal magnetization are mixed, and middle magnetization between vertical magnetization and horizontal magnetization also appears. However, a lower region and an upper region of the ferromagnetic layer 130 are adjacent to or in contact with the nonmagnetic metal layers 120 and 140, and vertical magnetic anisotropy predominantly appears in the vicinity of a region in contact with the nonmagnetic metal layers 120 and 140. This is determined by thicknesses of the lower nonmagnetic metal layer 120 and the upper nonmagnetic metal layer 140 and a thickness of the ferromagnetic layer 130. That is, when the lower nonmagnetic metal layer 120, the upper nonmagnetic metal layer 140, and the ferromagnetic layer 130 have a thickness in a certain range, vertical magnetic anisotropy predominantly appears at interfaces of the ferromagnetic layer 130 in contact with the nonmagnetic metal layers 120 and 140. High vertical magnetic anisotropy appearing at the interfaces causes spin orbit interaction up to the bulk region.

Due to the spin orbit interaction, in the ferromagnetic layer 130, the vertical magnetization is set as a magnetic easy axis. Therefore, when a magnetic field is applied in a direction perpendicular to the ferromagnetic layer 130, since a vertical direction becomes a magnetic easy axis, vertical magnetic anisotropy is enhanced in proportion to intensity of the magnetic field applied to the ferromagnetic layer 130, which appears as a Hall voltage.

The upper nonmagnetic metal layer 140 is formed on the ferromagnetic layer 130. The upper nonmagnetic metal layer 140 may be made of Pt or Pd. The upper nonmagnetic metal layer 140 induces vertical magnetic anisotropy at the interface of the ferromagnetic layer 130 thereunder. A magnetic easy axis of the ferromagnetic layer 130 is determined in a vertical direction by the induced vertical magnetic anisotropy. The upper nonmagnetic metal layer 140 may be made of the same material as the lower nonmagnetic metal layer 120 so as to secure magnetic symmetry. In addition, the thickness of the upper nonmagnetic metal layer 140 may be the same as the thickness of the lower nonmagnetic metal layer 120. As a result, the magnetic symmetry may be secured, magnetic easy axes in the bulk region of the ferromagnetic layer 130 may be symmetrically set, and an offset of a Hall voltage, which is an output voltage of a Hall sensor to be manufactured, may be minimized.

Figure 3:
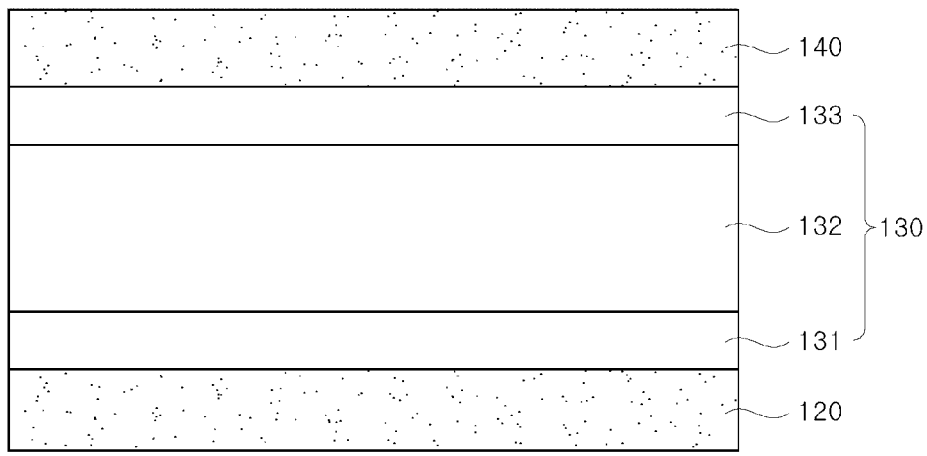
FIG. 3 is a detailed cross-sectional view of the magnetic sensor using the anomalous Hall effect of FIG. 2 according to the first embodiment of the present invention.

FIG. 3 is a detailed cross-sectional view of the magnetic sensor using the anomalous Hall effect of FIG. 2 according to the first embodiment of the present invention.

Referring to FIG. 3, the substrate and the buffer layer are omitted for convenience of description. In addition, the ferromagnetic layer 130 is provided between the lower nonmagnetic metal layer 120 and the upper nonmagnetic metal layer 140.

A first easy axis induction layer 131 having enhanced vertical magnetic anisotropy is formed in a certain region from the interface of the ferromagnetic layer 130 in contact with the lower nonmagnetic metal layer 120, and a second easy axis induction layer 133 is formed in a certain region of the ferromagnetic layer 130 in contact with the upper nonmagnetic metal layer 140. The two easy axis induction layers 131 and 133 are formed due to interaction the ferromagnetic layer 130 at the interfaces with the nonmagnetic metal layers 120 and 140. However, the first easy axis induction layer 131 and the second easy axis induction layer 133 are made of the same material as a bulk layer 132 and are described as separate layers in terms of vertical magnetic anisotropy. That is, the first easy axis induction layer 131 and the second easy axis induction layer 133 are characterized in that vertical magnetic anisotropy is predominant, and the bulk layer 132 between the easy axis induction layers 131 and 133 is characterized in that isotropy of a magnetization direction is predominant.

However, due to vertical magnetization of the first easy axis induction layer 131 and the second easy axis induction layer 133, spin orbit interaction occurs in the bulk layer 132, and thus, a magnetic easy axis in the bulk layer 132 is set in a vertical direction. Therefore, when an external magnetic field is applied in a direction perpendicular to a planar surface of the ferromagnetic layer 130, isotropy of the bulk layer 132 is converted into anisotropy, and when a current is applied in a direction of the planar surface of the ferromagnetic layer 130, a Hall voltage is generated in a direction perpendicular to the directions of the current and the magnetic field.

A magnitude of vertical magnetic anisotropy induced in the bulk layer 132 of the ferromagnetic layer 130 may be proportional to intensity of an applied magnetic field, and thus, it is possible to secure linearity of a Hall voltage which is an output voltage.

Manufacturing Example 1: Linear Property Through Change in Thickness of Ferromagnetic Layer A magnetic sensor is manufactured using a direct current (DC) magnetron sputter. Deposition pressure in a chamber is set to be in a range from 3 mTorr to 5 mTorr. In order for deposition to occur, each target is disposed, and gun power is used. A substrate is made of $SiO_2$, a buffer layer is made of Ta, a lower nonmagnetic metal layer is made of Pt, a ferromagnetic layer is made of CoFeSiB, and an upper nonmagnetic metal layer is made of the same Pt as the lower nonmagnetic metal layer. Gun power applied to a Ta target is 60 W, gun power applied to a Pt target is 60 W, and gun power applied to a CoFeSiB target is 80 W.

The above conditions are applied and a thickness of the ferromagnetic layer is changed by changing a sputtering time of a target, thereby manufacturing three samples. A thickness of Ta constituting the buffer layer deposited on the $SiO_2$ substrate is 50 Å, a thickness of Pt constituting the lower nonmagnetic metal layer is 25 Å, and a thickness of Pt constituting the upper nonmagnetic metal layer is 25 Å. The samples are divided according to the thickness of the ferromagnetic layer. The samples are classified in Table 1 below.

TABLE 1

| Classification | Thickness of Ta | Thickness of Pt in lower nonmagnetic metal layer | Thickness of CoFeSiB | Thickness of Pt in upper nonmagnetic metal layer |
| --- | --- | --- | --- | --- |
| Sample 1 | 50 Å | 25 Å | 25 Å | 25 Å |
| Sample 2 | | | 35 Å | |
| Sample 3 | | | 55 Å | |

Figure 4:
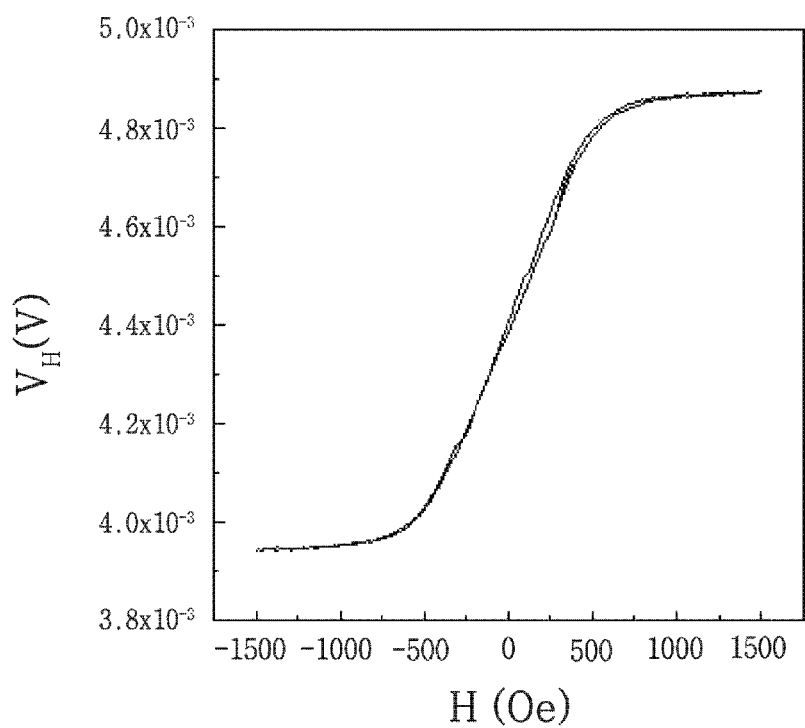
FIGS. 4 to 6 are graphs showing a linear property of an output voltage according to a change in thickness of a ferromagnetic layer according to Manufacturing Example 1 of the present invention.
Figure 5:
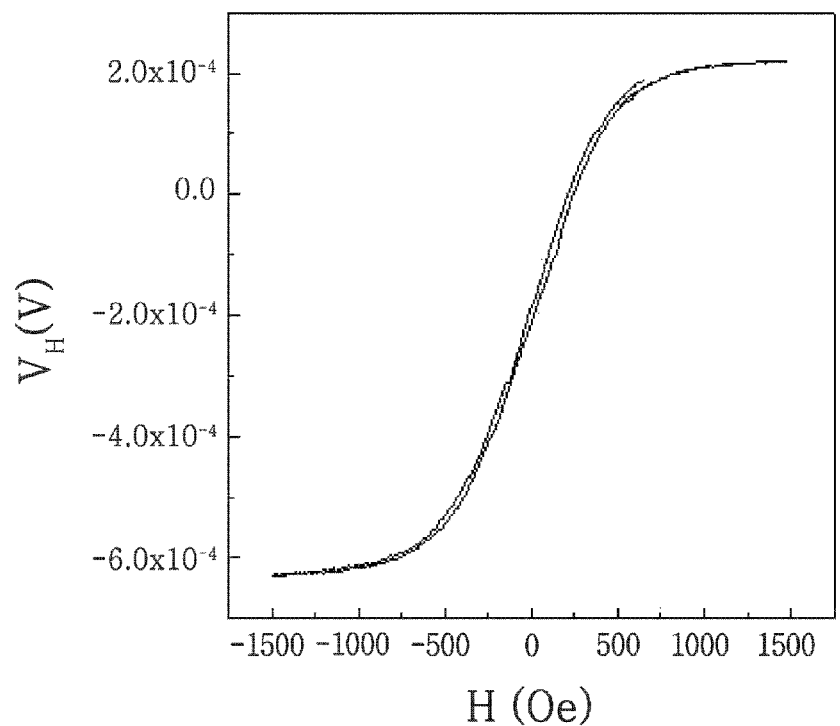
Figure 6:
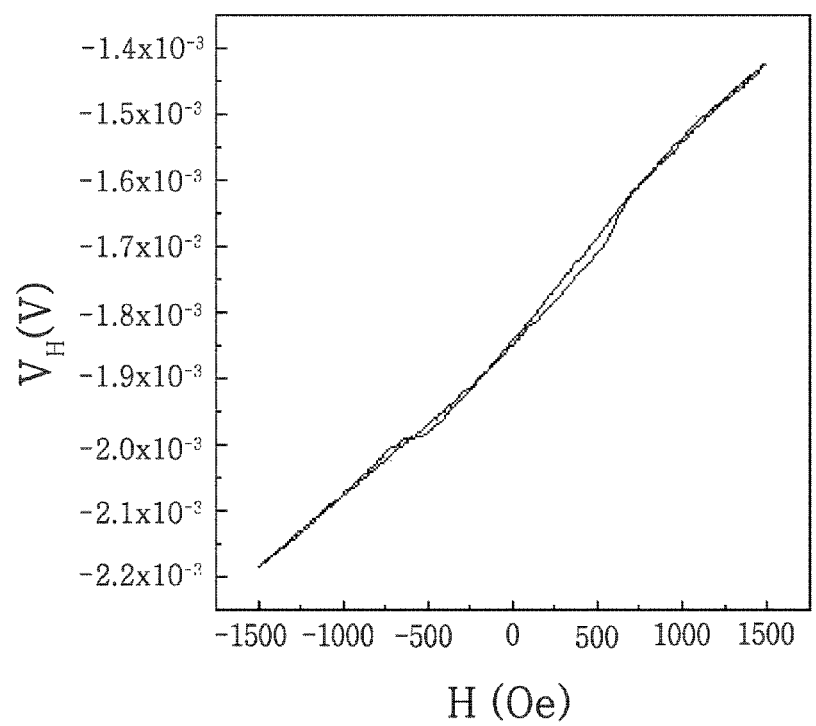

FIGS. 4 to 6 are graphs showing a linear property of an output voltage according to a change in thickness of the ferromagnetic layer according to Manufacturing Example 1 of the present invention.

The samples have a square shape, a current is applied to a surface of the upper nonmagnetic metal layer which is a top layer, and a magnetic field is applied in a direction perpendicular to a surface of the substrate. A Hall voltage is measured in a direction perpendicular to a direction of the applied current and to a direction of the applied magnetic field. That is, when a current is applied to facing sides of a square shape of the upper nonmagnetic metal layer, the Hall voltage is measured at sides perpendicular to the facing sides. A measurement method of the Hall voltage is equally applied to other Manufacturing Examples below.

Referring to FIG. 4, FIG. 4 shows a linear property of a Hall voltage which is an output voltage when a thickness of CoFeSiB is 25 Å. The Hall voltage shows an excellent linear property between about 4 mV and about 4.8 mV.

Referring to FIG. 5, FIG. 5 shows a linear property of a Hall voltage which is an output voltage when a thickness of CoFeSiB is 35 Å. The Hall voltage shows an excellent linear property between about −0.6 mV and about 0.2 mV. In FIGS. 4 and 5, rather than absolute value of the Hall voltage, it is necessary to note a difference value between the Hall voltages showing the linear property. In both of two graphs, it can be seen that the difference value between the Hall voltages is a value of 0.8 mV and the Hall voltages have an excellent linear property when the thickness of CoFeSiB is less than or equal to 35 Å. In addition, even when the thickness of CoFeSiB was reduced to 10 Å in another manufactured sample, the same linear property could be obtained. However, a linear property with respect to a thickness less than 10 Å is not confirmed due to a limitation of manufacturing equipment.

Referring to FIG. 6, FIG. 6 shows a linear property of a Hall voltage which is an output voltage when a thickness of CoFeSiB is 55 Å. A nonlinear property appears with respect to a magnetic field intensity of zero oersteds (Oe), and there is no saturation magnetization that should be required in a Hall sensor. Therefore, a specific range in which an applied magnetic field may be sensed is not determined, and due to the nonlinear property, the Hall sensor is not considered to be used as a magnetic sensor.

A matter confirmable in the present Manufacturing Example is that there is a certain limitation on the thickness of the ferromagnetic layer. That is, when the thickness of the ferromagnetic layer reaches 55 Å, it can be seen that vertical magnetic anisotropy of the ferromagnetic layer is damaged due to the increased thickness. Even when vertical magnetic anisotropy appears in an interface region due to the nonmagnetic metal layers disposed on and below the ferromagnetic layer, it can be confirmed that the thickness of the bulk layer is also increased due to the increased thickness and a magnetic easy axis is difficult to form. Although not shown in the graphs, when the thickness of the ferromagnetic layer exceeds 45 Å, linearity is degraded, and a curve related to saturation magnetization disappears and is changed into a linear curve. Therefore, the thickness of the ferromagnetic layer may be in a range of 10 Å to 45 Å.

In addition, the thickness of the ferromagnetic layer needs to be greater than or equal to the thickness of the upper nonmagnetic metal layer or the lower nonmagnetic metal layer. This is related to an amount of a current flowing in the ferromagnetic layer. A current needs to flow in the ferromagnetic layer in an amount greater than or equal to a certain ratio with respect to an amount of a current flowing to the nonmagnetic metal layer. The amount of the current flowing in the ferromagnetic layer may not be detected due to a limitation of measurement. The thickness of the ferromagnetic layer needs to have a value greater than or equal to the thickness of each of the nonmagnetic metal layers. Therefore, when a current is applied to a ferromagnetic material in an amount greater than or equal to a certain ratio with respect to the current flowing to the nonmagnetic metal layer, an anomalous Hall effect due to vertical magnetic anisotropy may appear, and linearity of a Hall voltage may be secured.

Manufacturing Example 2: Linear Property Through Change in Thickness of Buffer Layer A magnetic sensor is manufactured using a DC magnetron sputter. Pressure in a chamber and gun power with respect to a target for manufacturing the magnetic sensor are the same as those described in Manufacturing Example 1 above. However, thicknesses of a lower nonmagnetic metal layer, a ferromagnetic layer, and an upper nonmagnetic metal layer are fixed and a thickness of a buffer layer is changed, thereby manufacturing three samples. The manufactured samples classified according to the thickness of the buffer layer are shown in Table 2.

TABLE 2

| Classi-fication | Thickness of Ta in buffer layer | Thickness of Pt in lower nonmagnetic metal layer | Thickness of CoFeSiB | Thickness of Pt in upper nonmagnetic metal layer |
|---|---|---|---|---|
| Sample 4 | 30 Å | 25 Å | 35 Å | 25 Å |
| Sample 5 | 50 Å | | | |
| Sample 6 | 70 Å | | | |

Figure 7:
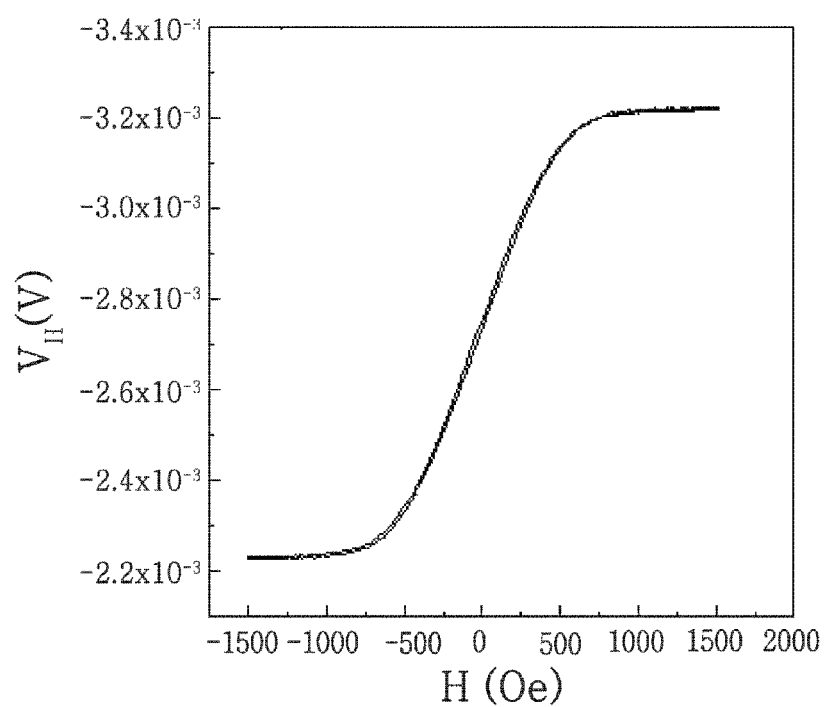
FIGS. 7 to 9 are graphs showing a linear property of an output voltage according to a change in thickness of a buffer layer according to Manufacturing Example 2 of the present invention.
Figure 8:
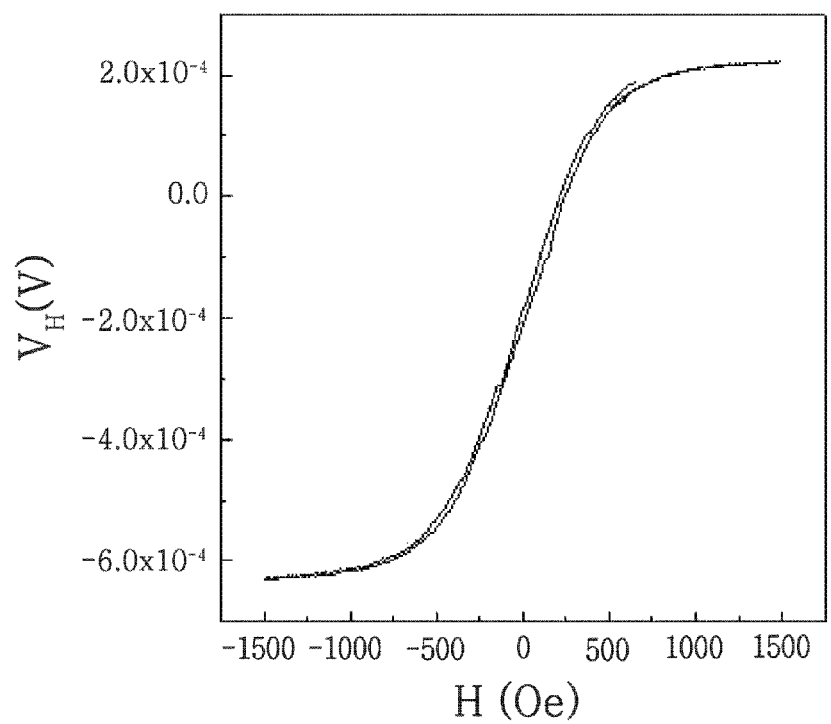
Figure 9:
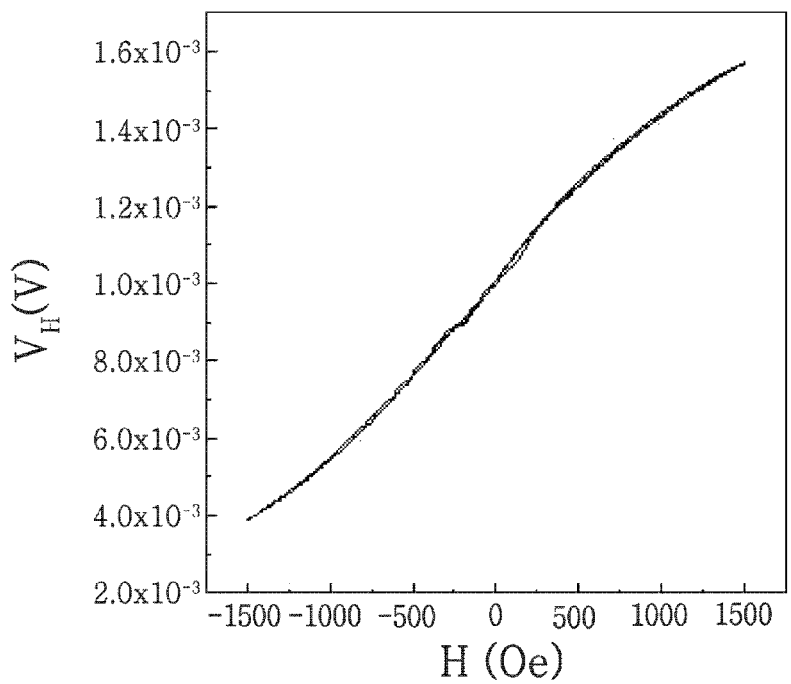

FIGS. 7 to 9 are graphs showing a linear property of an output voltage according to a change in thickness of the buffer layer according to Manufacturing Example 2 of the present invention.

Referring to FIG. 7, FIG. 7 shows a linear property of a Hall voltage which is an output voltage when a thickness of Ta constituting a buffer layer is 30 Å

In addition, referring to FIG. 8, FIG. 8 shows a linear property of a Hall voltage which is an output voltage when a thickness of Ta constituting a buffer layer is 50 Å

In FIGS. 7 and 8, when the thickness of Ta has a value of 50 Å or less, the Hall voltage shows a symmetrical and linear property with respect to zero Oe. Therefore, the thickness of the buffer layer may be less than or equal to 50 Å. As a result of performing measurement by setting a thickness of Ta constituting the buffer layer so as to be reduced to 10 Å due to a limitation of manufacturing equipment, even when the thickness of the buffer layer is reduced to 10 Å, it is confirmed that a linear property is not changed.

Referring to FIG. 9, when a thickness of Ta is 70 Å, linearity of a magnetic sensor is weakened, and responsiveness of a Hall voltage with respect to intensity of an applied magnetic field is lowered. Thus, when the thickness of the buffer layer is greater than or equal to a certain thickness, it can be seen that resolution of the magnetic sensor is reduced and sensitivity thereof is very weak. In particular, since saturation of magnetization completely disappears, the magnetic sensor may not be used as a magnetic sensor.

In the present Manufacturing Example, when the thickness of the buffer layer exceeds 50 Å, it can be seen that linearity of the Hall voltage is weakened and sensing sensitivity is lowered. This means that vertical magnetic anisotropy does not act smoothly in the ferromagnetic layer. When the thickness of the buffer layer exceeds 50 Å, stress generated between the buffer layer and the lower nonmagnetic metal layer is absorbed due to the large thickness of the buffer layer. Accordingly, stress applied to the ferromagnetic layer in the form of energy is also reduced at an interface of the lower nonmagnetic metal layer in contact with the ferromagnetic layer. As a result, intensity of vertical magnetization is reduced, and thus, vertical magnetic anisotropy is weakened.

Manufacturing Example 3: Linear Property Through Change in Thickness of Lower Nonmagnetic Metal Layer A magnetic sensor is manufactured using a DC magnetron sputter. Pressure in a chamber and gun power with respect to a target for manufacturing the magnetic sensor are the same as those described in Manufacturing Example 1 above. However, thicknesses of a buffer layer, a ferromagnetic layer, and an upper nonmagnetic metal layer are fixed and a thickness of a lower nonmagnetic metal layer is changed, thereby manufacturing three samples. The manufactured samples classified according to the thickness of the lower nonmagnetic metal layer are shown in Table 3.

TABLE 3

| Classi-fication | Thickness of Ta in buffer layer | Thickness of Pt as lower nonmagnetic metal layer | Thickness of CoFeSiB | Thickness of Pt in upper nonmagnetic metal layer |
|---|---|---|---|---|
| Sample 7 | 30 Å | 15 Å | 35 Å | 25 Å |
| Sample 8 | | 35 Å | | |
| Sample 9 | | 45 Å | | |

Figure 10:
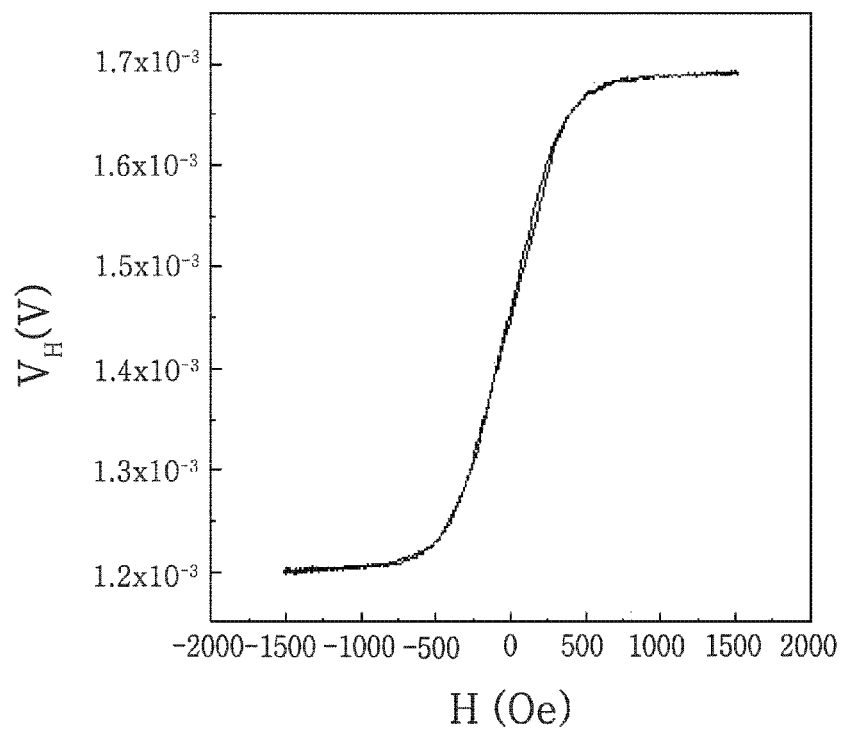
FIGS. 10 to 12 are graphs showing a linear property of an output voltage according to a change in thickness of a lower nonmagnetic metal layer according to Manufacturing Example 3 of the present invention.
Figure 11:
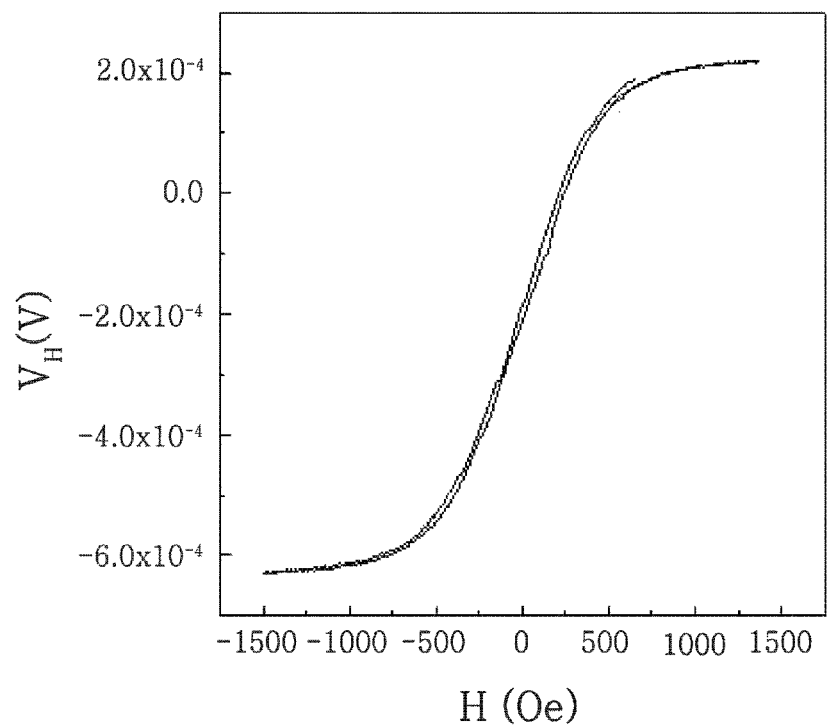
Figure 12:
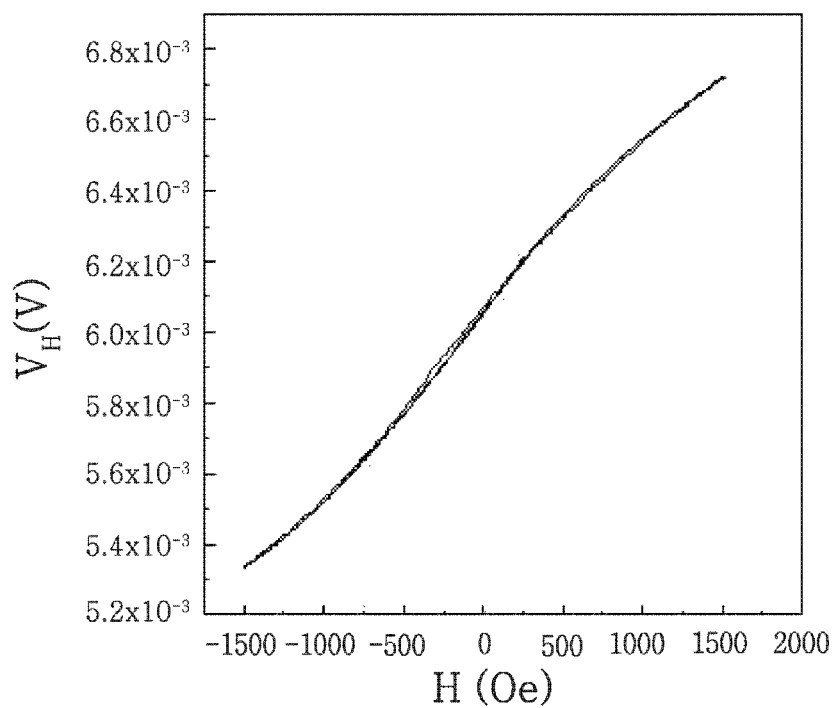

FIGS. 10 to 12 are graphs showing a linear property of an output voltage according to a change in thickness of the lower nonmagnetic metal layer according to Manufacturing Example 3 of the present invention.

Referring to FIG. 10, FIG. 10 shows a linear property of a Hall voltage which is an output voltage when a thickness of Pt constituting a lower nonmagnetic metal layer is 15 Å. Referring to FIG. 11, FIG. 11 shows a linear property of a Hall voltage which is an output voltage when a thickness of Pt constituting a lower nonmagnetic metal layer is 35 Å. Referring to FIG. 12, FIG. 12 shows a linear property of a Hall voltage which is an output voltage when a thickness of Pt constituting a lower nonmagnetic metal layer is 45 Å.

When the thickness of the lower nonmagnetic metal layer is less than or equal to the thickness of the ferromagnetic layer, it can be seen that a Hall voltage shows a linear property and a voltage difference between the Hall voltages is also the same in a linear trajectory before a saturation magnetization state. In addition, as the thickness of the lower nonmagnetic metal layer is reduced, it can be seen that the Hall voltage is abruptly changed even in a low magnetic field. This means that, as the thickness of the lower nonmagnetic metal layer is reduced, sensing sensitivity is improved.

The above-described data and phenomenon are interpreted in two ways.

First, as the thickness of the lower nonmagnetic metal layer is reduced, stress of a structure of the lower nonmagnetic metal layer greatly acts on an interface of a ferromagnetic material, thereby enhancing vertical magnetic anisotropy of the ferromagnetic material. That is, as the thickness of the lower nonmagnetic metal layer is reduced, the stress of the lower nonmagnetic metal layer is increased, which acts on an interface of a ferromagnetic material to enhance vertical magnetic anisotropy of a first easy axis induction layer of the ferromagnetic layer. Therefore, a magnetic easy axis is increased in a bulk layer of the ferromagnetic layer, and a Hall voltage reacts sensitively according to intensity of an applied magnetic field, thereby improving sensitivity and improving linearity.

Second, when the thickness of the lower nonmagnetic metal layer is set to be less than or equal to the thickness of the ferromagnetic layer, a current flows in the ferromagnetic layer in an amount greater than or equal to a certain ratio with respect to an amount of a current flowing to the lower nonmagnetic metal layer. An anomalous Hall effect is generated by the current flowing in the ferromagnetic layer, and linearity is improved by the anomalous Hall effect.

Unlike a semiconductor material, a conventional Hall effect and an anomalous Hall effect concurrently appear in the ferromagnetic layer. In the conventional Hall effect, a Hall voltage is generated in proportion to an applied magnetic field. However, since the ferromagnetic layer is made of a metal material, even when a current is supplied thereto, due to lattice scattering of electrons, the conventional Hall effect is not greater than that of the semiconductor. Therefore, when a thickness of the ferromagnetic material is set to be greater than or equal to the thickness of the lower nonmagnetic metal layer, contribution of the Hall voltage by the conventional Hall effect is reduced or insignificant. However, the contribution of the Hall voltage by the anomalous Hall effect is increased. This is due to spin polarization of electrons which are carriers in the ferromagnetic material. Movement of carriers in the ferromagnetic material depends on a spin, and an anomalous Hall effect is generated by spin orbit interaction. To this end, it can be seen that the anomalous Hall effect is maximized through a current flowing in an amount greater than or equal to a certain ratio with respect to an amount of a current flowing to the lower nonmagnetic metal layer.

As described above, in the present embodiment, the nonmagnetic metal layers are disposed on and below the ferromagnetic material, and the two nonmagnetic metal layers include the same material. In addition, the thickness of the ferromagnetic material is set to be less than or equal to 45 Å or less. When the thickness exceeds 45 Å, a magnetic easy axis in a vertical direction in the ferromagnetic material may be difficult to form, and vertical magnetic anisotropy may not be secured. Therefore, even when a magnetic field and an input current are increased, a sensitivity characteristic may not be secured, and linearity may be destroyed. In addition, the thickness of the nonmagnetic metal layer in contact with the ferromagnetic material is set to be less than or equal to the thickness of the ferromagnetic material. Therefore, a magnetic sensor with excellent linearity and high sensitivity may be obtained.

Second Embodiment

Figure 13:
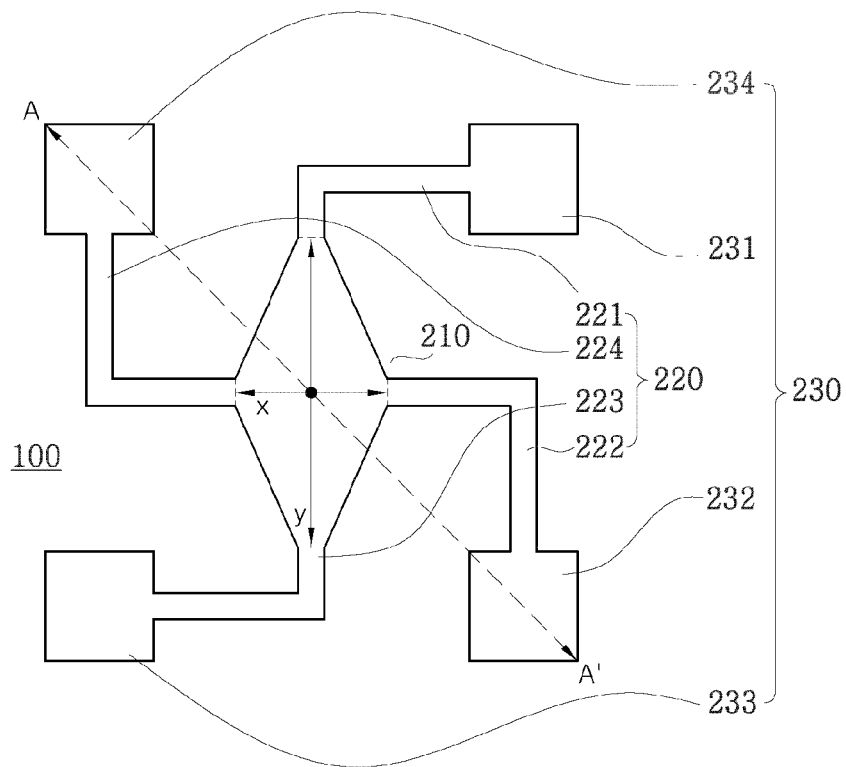
FIG. 13 is a plan view of a Hall sensor using an anomalous Hall effect according to a second embodiment of the present invention.

FIG. 13 is a plan view of a Hall sensor using an anomalous Hall effect according to a second embodiment of the present invention.

Referring to FIG. 13, the Hall sensor includes a sensing region 210, an electrode line portion 220, and a pad portion 230.

The sensing region 210, the electrode line portion 220, and the pad portion 230 are formed on a substrate 100. The substrate 100 may be made of an insulating material and may include $SiO_2$ or SiN. In addition, the substrate 100 may use any material as long as physical properties of the material are not significantly changed even when subsequent processes are performed.

The sensing region 210 has an approximately rhombic shape, and vertices of a rhombus are connected to the electrode line portion 220. In the sensing region 210, a Hall voltage is generated by an applied magnetic field. That is, a Hall voltage according to an anomalous Hall effect is generated in the sensing region 210. In the sensing region 210 having the rhombic shape, a Hall voltage is generated according to a change in vertical magnetic anisotropy. In addition, the sensing region 210 has a rhombic shape in order to secure linearity and increase a level of the generated Hall voltage.

Four vertices of the sensing region 210 are connected to the electrode line portion 220. The materials of the sensing region 210 and the electrode line portion 220 are exactly the same. For example, a first electrode line 221 and a third electrode line 223 are formed in a y direction which is parallel to a long axis of the rhombus. In addition, a second electrode line 222 and a fourth electrode line 224 are formed in an x direction which is parallel to a short axis of a rhombus. Further, a width in the y direction parallel to the long axis may be 1 time or 1.5 times a width in the x direction parallel to the short axis.

When an input current is applied in the x direction, two electrode lines 221 and 223 in the y direction are used to sense a Hall voltage. Of course, a magnetic field is applied in a direction perpendicular to a surface of the sensing region 210.

When the input current flows in the x direction, a current may be diffused along hypotenuses of the rhombus and may be uniformly supplied to an entire surface of the sensing region 210. Therefore, it is possible to induce an increase in Hall voltage with respect to a change in an applied magnetic field. In addition, whereas a conventional cross-shaped structure may use a magnetic field input to a central portion of a cross-shaped pattern to generate a Hall voltage, the sensing region 210 having the rhombic shape of the present invention may use all magnetic fields applied to the rhombus to generate a Hall voltage. In the present embodiment, it is described that the input current is applied in the x direction parallel to the short axis and the Hall voltage is output at two vertices in the y direction parallel to the long axis, but vice versa.

The electrode line portion 220 is integrally formed with the pad portion 230 and includes four pads 231, 232, 233, and 234.

Figure 14:
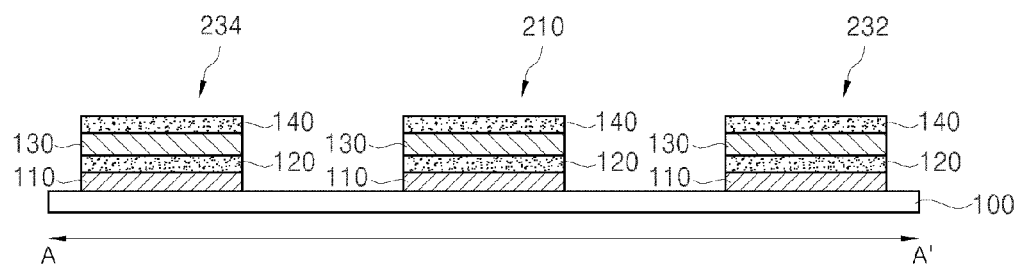
FIG. 14 is a cross-sectional view taken along line A-A' of the Hall sensor of FIG. 13 according to the second embodiment of the present invention.

FIG. 14 is a cross-sectional view taken along line A-A' of the Hall sensor of FIG. 13 according to the second embodiment of the present invention.

Referring to FIG. 14, a fourth pad 234, the sensing region 210, and a second pad 232 are shown on the substrate 100. The fourth pad 234, the sensing region 210, and the second pad 232 have the same stacked structure, and the same applies to other pads and the electrode line portion not shown in FIG. 14. That is, a stacked structure of the electrode line portion 220 and the pad portion 230 is the same as that of the sensing region 210.

Accordingly, the fourth pad 234 includes a buffer layer 110, a lower nonmagnetic metal layer 120, a ferromagnetic layer 130, and an upper nonmagnetic metal layer 140 on the substrate 100, and the same applies to the sensing region 210 and the second pad 232.

The buffer layer 110 is formed on the substrate 100. The buffer layer 110 is provided to facilitate the formation of the lower nonmagnetic metal layer 120. That is, when the lower nonmagnetic metal layer 120 is formed directly on the substrate 100 made of the insulating material, the lower nonmagnetic metal layer 120 may not have a predetermined lattice constant or may not form crystal grains, and thus, a polycrystalline structure may not be formed. Therefore, the lower nonmagnetic metal layer 120 is easily formed in a polycrystalline state through the formation of the buffer layer 110. The buffer layer 110 may be made of Ta, Ru, or Ti.

The lower nonmagnetic metal layer 120 is formed on the buffer layer 110. The lower nonmagnetic metal layer 120 is in a polycrystalline state and causes stress at an interface with the ferromagnetic layer 130. In addition, the lower nonmagnetic metal layer 120 induces vertical magnetic anisotropy at an interface portion of the ferromagnetic layer 130 through magnetic interaction at the interface with the ferromagnetic layer 130. The lower nonmagnetic metal layer 120 may be made of Pt or Pd.

The ferromagnetic layer 130 is formed on the lower nonmagnetic metal layer 120. The ferromagnetic layer 130 is made of an alloy of CoFeSiB. Vertical magnetic anisotropy and horizontal magnetic anisotropy are mixed in a bulk region in the ferromagnetic layer 130. That is, vertical magnetization and horizontal magnetization are mixed, and magnetization in a middle region between vertical magnetization and horizontal magnetization also appears. However, a lower region and an upper region of the ferromagnetic layer 130 are adjacent to or in contact with the nonmagnetic metal layers 120 and 140, and vertical magnetic anisotropy dominantly appears in the vicinity of a region in contact with the nonmagnetic metal layers 120 and 140. This is determined by thicknesses of the lower nonmagnetic metal layer 120 and the upper nonmagnetic metal layer 140 and a thickness of the ferromagnetic layer 130. That is, when the lower nonmagnetic metal layer 120, the upper nonmagnetic metal layer 140, and the ferromagnetic layer 130 have a thickness in a certain range, vertical magnetic anisotropy predominantly appears at interfaces of the ferromagnetic layer 130 in contact with the nonmagnetic metal layers 120 and 140. High vertical magnetic anisotropy appearing at the interface causes spin orbit interaction up to the bulk region.

Due to the spin orbit interaction, in the ferromagnetic layer 130, vertical magnetization is set as a magnetic easy axis. Therefore, when a magnetic field is applied in a direction perpendicular to the ferromagnetic layer 130, since a vertical direction becomes a magnetic easy axis, vertical magnetic anisotropy is enhanced in proportion to intensity of the magnetic field applied to the ferromagnetic layer 130, which appears as a Hall voltage.

The upper nonmagnetic metal layer 140 is formed on the ferromagnetic layer 130. The upper nonmagnetic metal layer 140 may be made of Pt or Pd. The upper nonmagnetic metal layer 140 induces vertical magnetic anisotropy at the interface of the lower ferromagnetic layer 130. The magnetic easy axis of the ferromagnetic layer 130 is determined in a vertical direction by the induced vertical magnetic anisotropy. The upper nonmagnetic metal layer 140 may be made of the same material as the lower nonmagnetic metal layer 120 so as to secure magnetic symmetry. In addition, the thickness of the upper nonmagnetic metal layer 140 may be the same as the thickness of the lower nonmagnetic metal layer 120. As a result, the magnetic symmetry may be secured, easy magnetization axes in the bulk region of the ferromagnetic layer 130 may be symmetrically set, and an offset of a Hall voltage, which is an output voltage of a Hall sensor to be manufactured, may be minimized.

In addition, in the present embodiment, an input current is first supplied to the upper nonmagnetic metal layer 140 through the pads. Since the upper nonmagnetic metal layer 140, the ferromagnetic layer 130, and the lower nonmagnetic metal layer 120 are made of a metal material, an input current is diffused and flows in compliance with each resistance. Furthermore, two remaining pads corresponding to the pads determined as input terminals form output terminals. The Hall voltage, which is output, is output through the upper nonmagnetic metal layer 140.

Figure 15:
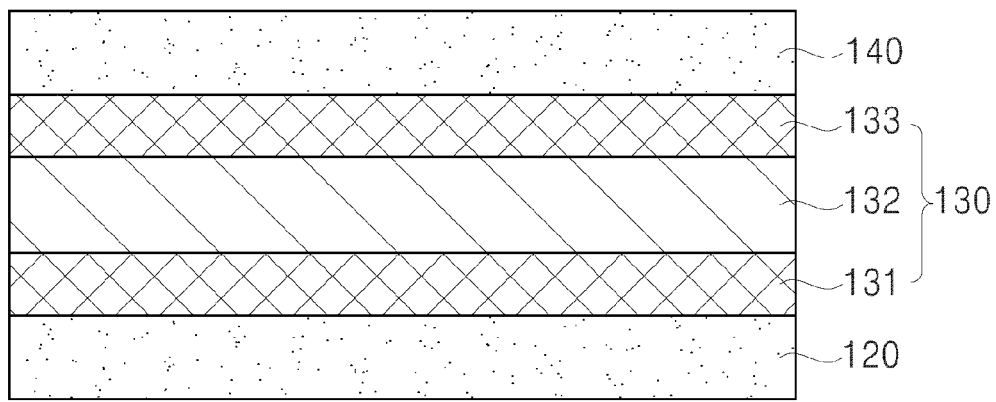
FIG. 15 is a detailed cross-sectional view for describing operations of a sensing region of the Hall sensor of FIG. 13 according to the second embodiment of the present invention.

FIG. 15 is a detailed cross-sectional view for describing operations of the sensing region of the Hall sensor of FIG. 13 according to the second embodiment of the present invention.

Referring to FIG. 15, the substrate and the buffer layer are omitted for convenience of description. In addition, the ferromagnetic layer 130 is provided between the lower nonmagnetic metal layer 120 and the upper nonmagnetic metal layer 140.

A first easy axis induction layer 131 having enhanced vertical magnetic anisotropy is formed in a certain region from the interface of the ferromagnetic layer 130 in contact with the lower nonmagnetic metal layer 120, and a second easy axis induction layer 133 is formed in a certain region of the layer 130 in contact with the upper nonmagnetic metal layer 140. The two easy axis induction layers 131 and 133 are formed due to interaction at the interfaces with the nonmagnetic metal layers 120 and 140. However, the first easy axis induction layer 131 and the second easy axis induction layer 133 are made of the same material as a bulk layer 132 and are described as separate layers in terms of vertical magnetic anisotropy. That is, the first easy axis induction layer 131 and the second easy axis induction layer 133 are characterized in that vertical magnetic anisotropy is predominant, and the bulk layer 132 between the easy axis induction layers 131 and 133 is characterized in that isotropy of a magnetization direction is predominant.

However, due to vertical magnetization of the first easy axis induction layer 131 and the second easy axis induction layer 133, spin orbit interaction occurs in the bulk layer 132, and thus, a magnetic easy axis in the bulk layer 132 is set in a vertical direction. Therefore, when an external magnetic field is applied in a direction perpendicular to a planar surface of the ferromagnetic layer 130, isotropy of the bulk layer 132 is converted into anisotropy, and when a current is applied in a direction of the planar surface of the ferromagnetic layer 130, a Hall voltage is generated in a direction perpendicular to the directions of the current and the magnetic field.

A magnitude of vertical magnetic anisotropy induced in the bulk layer 132 of the ferromagnetic layer 130 may be proportional to intensity of an applied magnetic field, and thus, it is possible to secure linearity of a Hall voltage which is an output voltage.

The above-described phenomenon, in which vertical magnetic anisotropy is changed by intensity of an applied magnetic field, also occurs in the electrode line portion and the pad portion, and thus, a noise component is likely to occur in the Hall voltage which is the output voltage. However, the Hall voltage is data that is measurable only when all output nodes for measuring a magnetic field applied perpendicular to a surface of the ferromagnetic layer, an input current, and a Hall voltage are provided in one element. That is, the electrode line portion lacks any one of the input current and the output node, and the pad portion also lacks any one of the input current and the output node, and thus, the electrode line portion and the pad portion do not affect a Hall voltage generated in the sensing region.

Figure 16:
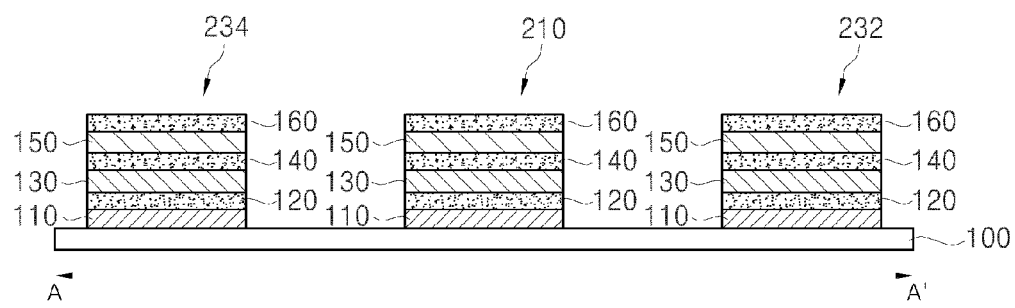
FIG. 16 is another cross-sectional view taken along line A-A' of the Hall sensor of FIG. 13 according to the second embodiment of the present invention.

FIG. 16 is another cross-sectional view taken along line A-A' of the Hall sensor of FIG. 13 according to the second embodiment of the present invention.

Referring to FIG. 16, the fourth pad 234, the sensing region 210, and the second pad 232 are formed on the substrate 100. The fourth pad 234, the sensing region 210, and the second pad 232 have the same stacked structure. The same applies to an electrode line portion. That is, the electrode line portion 220, the pad portion 230, and the sensing region 210 have the same stacked structure. However, the stacked structure is a structure in which a ferromagnetic layer and a nonmagnetic metal layer are added to the stacked structure shown in FIG. 14.

In FIG. 16, the buffer layer 110, a lower nonmagnetic metal layer 120, a ferromagnetic layer 130, an upper nonmagnetic metal layer 140, an additional ferromagnetic layer 150, and an additional nonmagnetic metal layer 160 are formed on the substrate 100.

The material of the buffer layer 110 is the same as that described with reference to FIG. 14. Therefore, the buffer layer 110 may be made of Ta, Ru, or Ti. In addition, the material of the nonmagnetic metal layers 120, 140, and 160 includes Pt or Pd as described above with reference to FIG. 14. In addition, the material of the ferromagnetic layers 130 and 150 includes CoFeSiB. That is, FIG. 16 shows a structure in which the nonmagnetic metal layers 120, 140, and 160 are arranged on and below the ferromagnetic layers 130 and 150 and the arrangement is repeated. However, the additional ferromagnetic layer 150 has a structure which shares one nonmagnetic metal layer 140, which is interposed between the additional ferromagnetic layer 150 and the lower ferromagnetic layer 130 thereunder, with the lower ferromagnetic layer 130.

In FIGS. 13 to 16, a thickness of each buffer layer 110 may be in a range of 10 Å to 50 Å. When the thickness of the buffer layer 110 exceeds 50 Å, it can be seen that linearity of a Hall voltage is weakened and sensing sensitivity is lowered. This means that vertical magnetic anisotropy does not smoothly act in the ferromagnetic layer. When the thickness of the buffer layer 110 exceeds 50 Å, stress generated between the buffer layer 110 and the lower nonmagnetic metal layer 120 is absorbed due to the large thickness of the buffer layer 110. Therefore, stress applied to the ferromagnetic layer 130 in the form of energy is also reduced at an interface of the lower nonmagnetic metal layer 120 in contact with the ferromagnetic layer 130. As a result, intensity of vertical magnetization is reduced, and thus, vertical magnetic anisotropy is weakened.

In addition, whether the buffer layer 110 having a thickness less than 10 Å is manufactured cannot be confirmed with equipment possessed by the inventors of the present application.

In addition, the thickness of each of the ferromagnetic layers 130 and 150 may be in a range of 10 Å to 45 Å. It is difficult to manufacture the ferromagnetic layers 130 and 150 including a CoFeSiB material to have a thickness less than 10 Å. In addition, when the thickness of the ferromagnetic layers 130 and 150 exceeds 45 Å, it is confirmed that linearity is degraded, a curve related to saturation magnetization disappears, and very low sensitivity is obtained with respect to an applied magnetic field.

In addition, the thickness of each of the nonmagnetic metal layers 120, 140, and 160 may be less than or equal to the thickness of the ferromagnetic layers 130 and 150. However, manufacturing the nonmagnetic metal layers 120, 140, and 160 to have a thickness less than 10 Å is very difficult in view of a process. Therefore, the thickness of the nonmagnetic metal layers 120, 140, and 160 needs to be greater than or equal to 10 Å and less than or equal to the thickness of the ferromagnetic layers 130 and 150. When the thickness of the nonmagnetic metal layers 120, 140, and 160 is less than or equal to the thickness of the ferromagnetic layers 130 and 150, it can be seen that a Hall voltage shows a linear property, and a voltage difference is also the same in a linear trajectory before a saturation magnetization state. In addition, as the thickness of the nonmagnetic metal layers 120, 140, and 160 is reduced, a Hall voltage tends to be abruptly changed even in a low magnetic field. This means that, as the thickness of the nonmagnetic metal layers 120, 140, and 160 is reduced, sensing sensitivity is improved.

In addition, when the thickness of the nonmagnetic metal layers 120, 140, and 160 exceeds the thickness of the ferromagnetic layers 130 and 150, linearity is degraded, and saturation magnetization is not generated. Sensitivity is also abruptly lowered. This means that, when a current flowing in the nonmagnetic metal layers 120, 140, and 160 exceeds a current flowing in the ferromagnetic layers 130 and 15 and a current is concentrated in the nonmagnetic metal layers 120, 140, and 160 at a certain ratio or more, it is difficult to remove magnetic anisotropy.

In particular, the nonmagnetic metal layers 120, 140, and 160 having increased thickness may not cause energy or stress at interfaces with the ferromagnetic layers 130 and 150 including thick bulk regions therein. Therefore, it is difficult to generate a magnetic easy axis according to vertical magnetic anisotropy.

Figure 17:
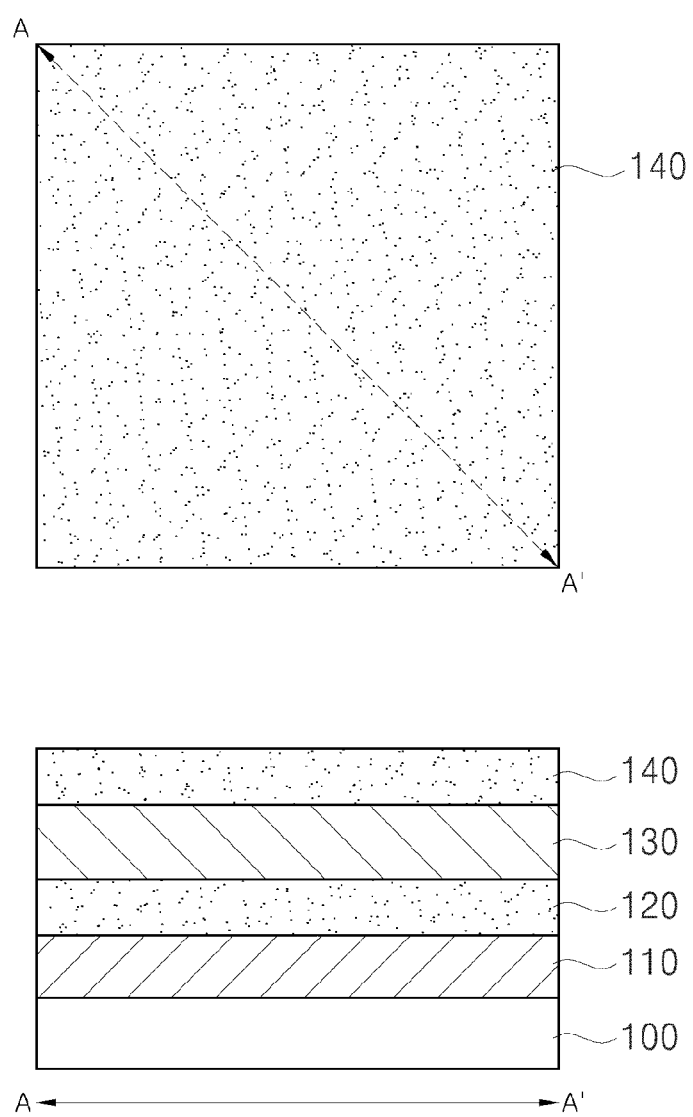
FIGS. 17 and 18 show plan views and cross-sectional views illustrating a method of manufacturing the Hall sensor of FIGS. 13 and 14 according to the second embodiment of the present invention.
Figure 18:
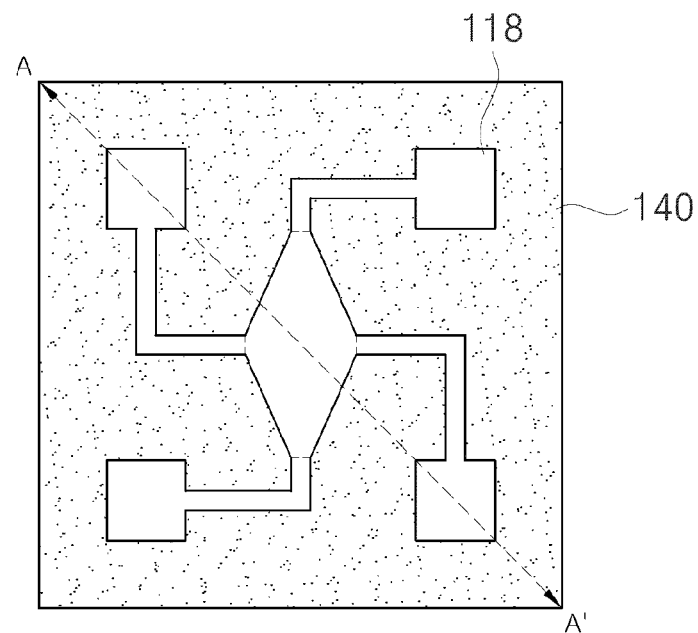
Figure 18:
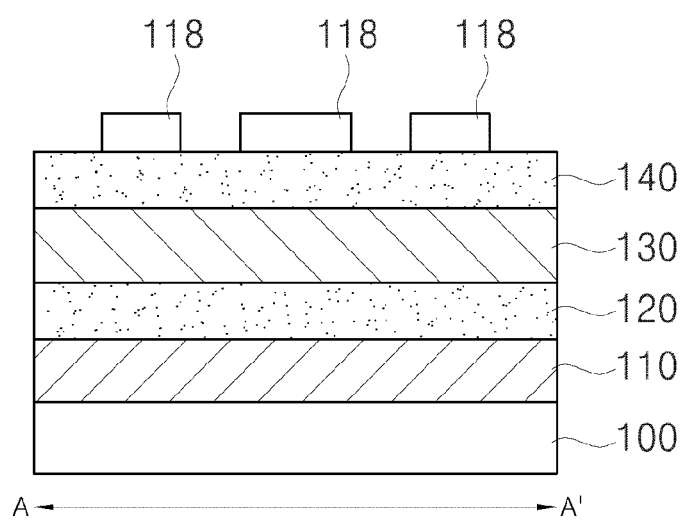

FIGS. 17 and 18 show plan views and cross-sectional views illustrating a method of manufacturing the Hall sensor of FIGS. 13 and 14 according to the second embodiment of the present invention.

Referring to FIG. 17, the buffer layer 110, the lower nonmagnetic metal layer 120, the ferromagnetic layer 130, and the upper nonmagnetic metal layer 140 are sequentially formed on the substrate 100 through various methods including sputtering. The thickness and material of each layer are the same as those described above.

Therefore, the layers are formed on an entire surface of the substrate 100, and the upper nonmagnetic metal layer 140 is exposed at a top layer.

Referring to FIG. 18, a photoresist pattern 118 is formed on the upper nonmagnetic metal layer 140 of the top layer. The photoresist pattern 118 is formed according to a known photolithography process. That is, a photoresist is applied on the upper nonmagnetic metal layer 140, and the photoresist pattern 118 is formed through a typical photolithography process.

Next, etching is performed using the formed photoresist pattern 118 as an etching mask such that a portion of the substrate 100 below the photoresist pattern 118 is exposed. Thus, a Hall sensor pattern shape shown in FIGS. 13 and 14 may be obtained.

Subsequently, the photoresist pattern 118 on the substrate 100 is removed using a process including ashing, and a surface of the upper nonmagnetic metal layer 140 of the top layer is exposed.

In the above-described manufacturing process, the sensing region 210 of the present embodiment has the same stacked structure as the electrode line portion 220. In addition, the sensing region 210 also has the same stacked structure as the pad portion 230. That is, separate metal layer forming and patterning processes for forming an electrode line are not required. The same applies to the pad portion.

That is, the sensing region, the electrode line portion, and the pad portion are concurrently formed by performing forming and etching processes of a photoresist pattern only once. Therefore, complicated processes may be omitted in a production process, and productivity may be improved.

Manufacturing Example 4: Measurement of Hall Voltage According to Change in Pattern A Hall sensor is manufactured using a DC magnetron sputter. Deposition pressure in a chamber is set to a range of 3 mTorr to 5 mTorr. In order for deposition to occur, each target is disposed, and gun power was used. A substrate is made of $SiO_2$, a buffer layer is made of Ta, a lower nonmagnetic metal layer is made of Pt, a ferromagnetic layer is made of CoFeSiB, and an upper nonmagnetic metal layer is made of the same Pt as the lower nonmagnetic metal layer. Gun power applied to a Ta target is 60 W, gun power applied to a Pt target is 60 W, and gun power applied to a CoFeSiB target is 80 W.

The above conditions are applied and a width of an electrode line portion is changed in a mask pattern, thereby manufacturing four samples. A thickness of Ta constituting the buffer layer deposited on the $SiO_2$ substrate is 50 Å, a thickness of Pt constituting the lower nonmagnetic metal layer is 25 Å, a thickness of Pt constituting the upper nonmagnetic metal layer is 25 Å, and a thickness of CoFeSiB constituting the ferromagnetic layer is 35 Å.

In order to divide the samples, input resistance is divided into four values by changing a line width of the electrode line portion. In addition, input lines are set to face each other, and output lines are set to face each other. A line width is adjusted to set output resistance to 1.3 kΩ. The samples divided according to a change in input resistance are classified in Table 4 below.

TABLE 4

| Classification | Input line width | Input resistance | Output line width | Output resistance |
| --- | --- | --- | --- | --- |
| Sample 1 | 25 μm | 1.6 kΩ | 50 μm | 1.3 kΩ |
| Sample 2 | 50 μm | 1.2 kΩ | | |
| Sample 3 | 75 μm | 890 Ω | | |
| Sample 4 | 100 μm | 550 Ω | | |

FIGS. 19 to 22 are graphs showing a change in Hall voltage according to application of a magnetic field according to Manufacturing Example 4 of the present invention.

Figure 19:
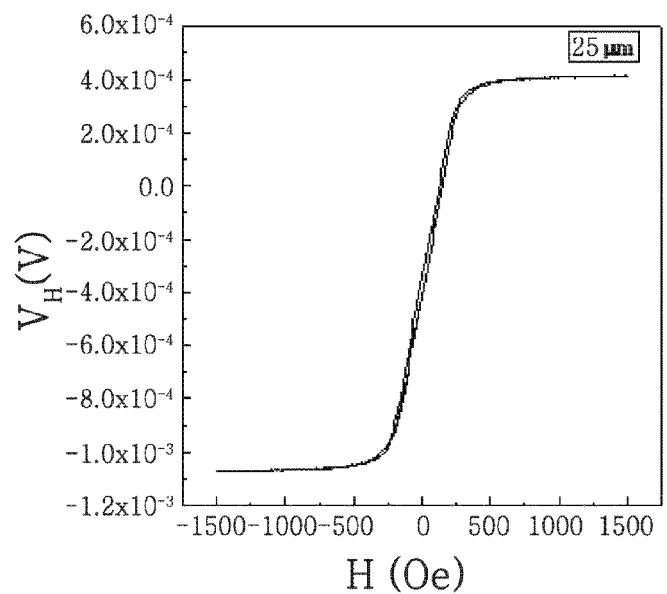
FIGS. 19 to 22 are graphs showing a change in Hall voltage according to application of a magnetic field according to Manufacturing Example 4 of the present invention.
Figure 20:
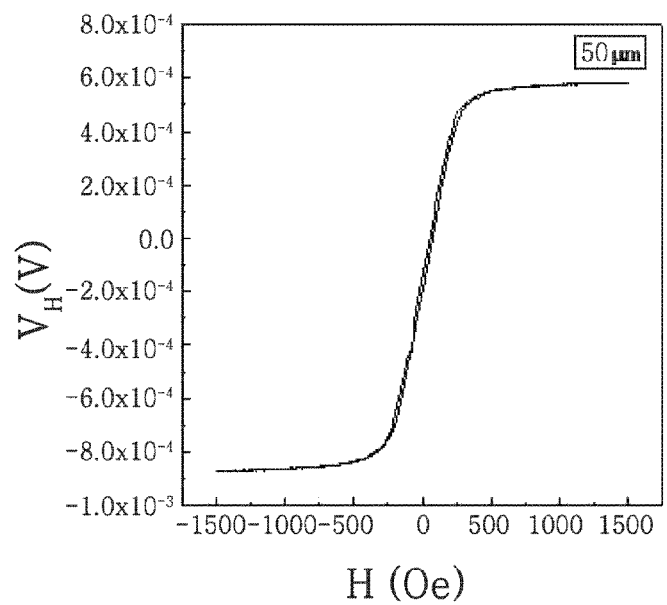
Figure 21:
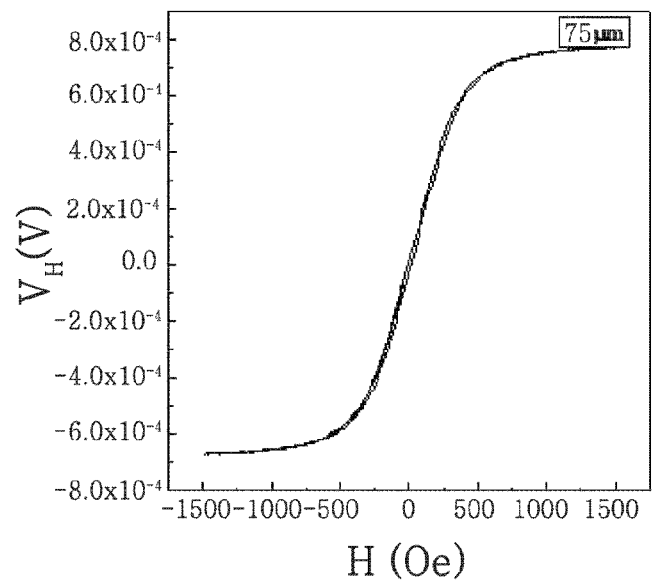
Figure 22:
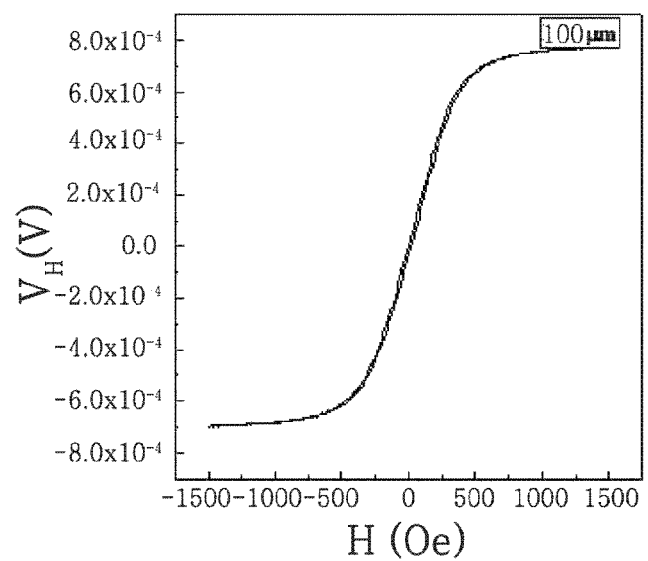

Referring to FIG. 19, FIG. 19 shows a change in Hall voltage when input resistance is 1.6 kΩ, and FIG. 20 shows a change in Hall voltage when input resistance is 1.2 kΩ. In addition, FIG. 21 shows a change in Hall voltage when input resistance is 890 kΩ, and FIG. 22 shows a change in Hall voltage when input resistance is 550 kΩ.

In addition, in the sensing region of the pattern of FIG. 13, a width ratio of a long axis to a short axis is 1.5, an input current is applied to the short axis, and a Hall voltage is measured at a vertex of the long axis. The Hall voltage is performed by probing the upper nonmagnetic metal layer exposed at the pad portion.

In all of FIGS. 9 to 12, an absolute value of a difference between a Hall voltage when intensity of an applied magnetic field has a negative value and saturation magnetization is formed and a Hall voltage when a magnetic field has a positive value and saturation magnetization is formed is a value of about $14 \times 10^{-4}$ V. That is, even when a value of input resistance is changed, it can be seen that characteristics of the Hall voltage are hardly changed. Therefore, even when a width of an electrode line for input is slightly changed, Hall sensors having the same characteristics may be obtained. In a Hall sensor, a change in Hall voltage also needs to be sensitive when intensity of an applied magnetic field is changed. Thus, improved sensitivity may be obtained. However, when a width of the electrode line for input is changed in a pattern in which a Hall sensor is implemented and the change in the width of the electrode line changes a Hall voltage, the change in the Hall voltage becomes a factor that impairs a yield and characteristic stability of the Hall sensor. However, in the present embodiment, the electrode line portion and the pad portion have the same stacked structure as the sensing region, a connection of each element is in a physically continuous state and the element is formed by patterning one stacked structure.

In addition, even when a magnetic field is applied to the electrode line portion and the pad portion, any one of an input current and an output node is in a lacking state, thereby forming a stable Hall voltage.

In the present embodiment described above, the electrode line portion and the pad portion have the same stacked structure as the sensing region. That is, in a manufacturing process, one photo mask may be used, and an etching process may be performed once, thereby manufacturing a Hall sensor. Thus, high productivity is secured.

In the present embodiment, a magnetic field applied in a direction perpendicular to an interface is used, and an anomalous Hall effect is used in which intensity of vertical magnetic anisotropy of a ferromagnetic layer is changed according to the applied magnetic field. Therefore, it is possible to obtain a Hall sensor which is insensitive to a change in temperature change and has high sensitivity, and it is possible to induce a Hall effect by applying a magnetic field in a direction perpendicular to an interface of the ferromagnetic layer, thereby applying the Hall sensor in a very flexible use environment.

The invention claimed is:

1. A magnetic sensor using an anomalous Hall effect, comprising:
    a lower nonmagnetic metal layer which is formed on a substrate and has a polycrystalline structure;
    a ferromagnetic layer which is formed on the lower nonmagnetic metal layer and in the which an anomalous Hall effect is generated by an applied magnetic field; and
    an upper nonmagnetic metal layer which is formed on the ferromagnetic layer and has the polycrystalline structure
    wherein the ferromagnetic layer includes:
        a first easy axis induction layer which is formed in an interface region in contact with the lower nonmagnetic metal layer and has a predominant vertical magnetic anisotropy;
        a second easy axis induction layer which is formed in an interface region in contact with the upper nonmagnetic metal layer and has a predominant vertical magnetic anisotropy; and
        a bulk layer which is disposed between the first easy axis induction layer and the second easy axis induction layer and has a predominant magnetization isotropy,
        wherein the first easy axis induction layer, the second easy axis induction layer, and the bulk layer are made of the same material.

2. The magnetic sensor of claim 1, wherein the ferromagnetic layer has a thickness that is greater than or equal to that of the lower nonmagnetic metal layer or the upper nonmagnetic metal layer.

3. The magnetic sensor of claim 2, wherein the ferromagnetic layer includes CoFeSiB and has a thickness ranging from 10 Å (angstroms) to 45 Å.

4. The magnetic sensor of claim 2, wherein the lower nonmagnetic metal layer or the upper nonmagnetic metal layer includes platinum (Pt) or palladium (Pd).

5. The magnetic sensor of claim 4, wherein the lower nonmagnetic metal layer is made of the same material as the upper nonmagnetic metal layer and includes platinum (Pt).

6. The magnetic sensor of claim 1, wherein the bulk layer has a magnetic easy axis in a vertical direction in the ferromagnetic layer due to an influence of vertical magnetization of the first easy axis induction layer or the second easy axis induction layer.

7. The magnetic sensor of claim 1, wherein a Hall voltage is formed in proportion to intensity of a magnetic field applied in a direction perpendicular to an interface of the ferromagnetic layer.

8. The magnetic sensor of claim 1, further comprising a buffer layer which is disposed between the substrate and the lower nonmagnetic metal layer to induce formation of the polycrystalline structure of the lower nonmagnetic metal layer.

9. The magnetic sensor of claim 8, wherein the buffer layer has a thickness ranging from 10 Å (angstroms) to 50 Å.

10. The magnetic sensor of claim 9, wherein the buffer layer includes tantalum (Ta), ruthenium (Ru), or titanium (Ti).

11. A Hall sensor using an anomalous Hall effect, comprising:
a sensing region which has a rhombic shape and generates a Hall voltage according to a Hall effect with respect to a magnetic field applied perpendicular thereto;
an electrode line portion which is integrally connected to vertices of the rhombic shape of the sensing region and through which an input current is applied and the Hall voltage is output; and
a pad portion which is integrally formed with the electrode line portion,
wherein the sensing region includes:
a lower nonmagnetic metal layer formed on a substrate;
a ferromagnetic layer which is formed on the lower nonmagnetic metal layer and generates the Hall voltage according to the magnetic field applied perpendicular to an interface thereof; and
an upper nonmagnetic metal layer formed on the ferromagnetic layer,
wherein the ferromagnetic layer includes:
a first easy axis induction layer which is formed from the interface in contact with the lower nonmagnetic metal layer and has a predominant vertical magnetic anisotropy;
a bulk layer which is formed on the first easy axis induction layer and has a predominant magnetization isotropy; and
a second easy axis induction layer which is formed on the bulk layer, is formed from the interface in contact with the upper nonmagnetic metal layer, and has a predominant magnetic anisotropy due to magnetic induction of the upper nonmagnetic metal layer,
wherein the first easy axis induction layer, the bulk layer, and the second easy axis induction layer are made of the same material.

12. The Hall sensor of claim 11, wherein the ferromagnetic layer includes CoFeSiB and has a magnetic easy axis in a direction perpendicular to the interface due to induced vertical magnetic anisotropy at the interface in contact with the lower nonmagnetic metal layer or the upper nonmagnetic metal layer.

13. The Hall sensor of claim 12, wherein the lower nonmagnetic metal layer includes platinum (Pt) or palladium (Pd).

14. The Hall sensor of claim 12, wherein the upper nonmagnetic metal layer includes platinum (Pt) or palladium (Pd).

15. The Hall sensor of claim 11, wherein the ferromagnetic layer has a thickness that is greater than or equal to that of the lower nonmagnetic metal layer or the upper nonmagnetic metal layer.

16. The Hall sensor of claim 15, wherein the ferromagnetic layer has a thickness ranging from 10 Å (angstroms) to 45 Å.

17. The Hall sensor of claim 11, further comprising a buffer layer which is disposed between the substrate and the lower nonmagnetic metal layer to induce formation of a polycrystalline structure of the lower nonmagnetic metal layer.

18. The Hall sensor of claim 17, wherein the buffer layer has a thickness ranging from 10 Å (angstroms) to 50 Å.

19. The Hall sensor of claim 18, wherein the buffer layer includes tantalum (Ta), ruthenium (Ru), or titanium (Ti).

20. The Hall sensor of claim 11, wherein the electrode line portion has the same stacked structure as the sensing region, and
layers constituting the sensing region are integrally connected.

21. The Hall sensor of claim 11, wherein the pad portion has the same stacked structure as the sensing region, and
layers constituting the electrode line portion are integrally connected.

22. The Hall sensor of claim 11, wherein, in the rhombic shape of the sensing region, a width of a long axis is 1 to 1.5 times a width of a short axis.

23. A method of manufacturing a Hall sensor using an anomalous Hall effect, the method comprising:
sequentially forming a lower nonmagnetic metal layer, a ferromagnetic layer, and an upper nonmagnetic metal layer on a substrate;
forming a photoresist pattern on the upper nonmagnetic metal layer; and
performing selective etching using the photoresist pattern as an etching mask to expose a portion of the substrate and to concurrently form a sensing region which has a rhombic shape and generates a Hall voltage according to a Hall effect with respect to a magnetic field applied perpendicular thereto, an electrode line portion which is integrally connected to vertices of the rhombic shape of the sensing region and through which an input current is applied and the Hall voltage is output, and a pad portion which is integrally formed with the electrode line portion.

24. The method of claim 23, further comprising, prior to the forming of the lower nonmagnetic metal layer, forming a buffer layer which induces a polycrystalline structure of the lower nonmagnetic metal layer.

25. The method of claim 23, wherein the input current is applied through the upper nonmagnetic metal layer of a top layer of the electrode line portion connected to facing vertices of the sensing region.

26. The method of claim 25, wherein the Hall voltage is output through the upper nonmagnetic metal layer of the top layer of the electrode line portion connected to vertices of the sensing region, through which the input current is not applied.

* * * * *